United States Patent [19]

White

[11] Patent Number: 4,618,197
[45] Date of Patent: Oct. 21, 1986

[54] EXOSKELETAL PACKAGING SCHEME FOR CIRCUIT BOARDS

[75] Inventor: Billy W. White, Duncan, Okla.

[73] Assignee: Halliburton Company, Duncan, Okla.

[21] Appl. No.: 747,077

[22] Filed: Jun. 19, 1985

[51] Int. Cl.[4] ............................................. H05K 7/00
[52] U.S. Cl. .................................. 339/17 R; 166/65.1; 361/399
[58] Field of Search ............. 339/17 R, 17 L, 17 LM, 339/17 M; 166/65.1, 66; 361/331, 394, 395, 399, 386; 73/151

[56] References Cited

U.S. PATENT DOCUMENTS

| | | | |
|---|---|---|---|
| 2,605,315 | 7/1952 | Hargett | 339/89 M |
| 3,176,259 | 3/1965 | Macnamara | 339/91 |
| 3,719,918 | 3/1973 | Kerr | 339/90 R |
| 4,094,567 | 6/1978 | Karcher et al. | 339/15 |
| 4,149,219 | 4/1979 | Kraft | 361/386 |
| 4,196,467 | 4/1980 | Jacob et al. | 361/399 |
| 4,304,456 | 12/1981 | Takaki et al. | 339/117 R |
| 4,399,487 | 8/1983 | Neumann | 361/399 |
| 4,400,858 | 8/1983 | Goiffon et al. | 361/386 |
| 4,445,743 | 5/1984 | Bakker | 339/90 R |
| 4,479,383 | 10/1984 | Bravenec | 73/151 |
| 4,547,833 | 10/1985 | Sharp | 361/386 |

FOREIGN PATENT DOCUMENTS

| | | | |
|---|---|---|---|
| 0148694 | 12/1984 | European Pat. Off. | |
| 2231180 | 12/1974 | France | 361/399 |
| 2417785 | 10/1979 | France | 361/331 |

OTHER PUBLICATIONS

U.S. Application Ser. No. 624,877 by Billy Wayne White filed Jun. 26, 1984.

Primary Examiner—Neil Abrams
Attorney, Agent, or Firm—Joseph A. Walkowski

[57] ABSTRACT

The present invention comprises an exoskeletal packaging arrangement for electronic circuitry and components employed in downhole tools such as are deployed in the bores of oil and gas wells. The invention includes a monocoque structure comprising interlocked bulkheads and shell plates, within which the electronic circuitry and components are protected in substantial isolation from vibration and shock. Also included in the invention is a coupling for providing an environmentally sealed electrical connection between adjacent tool housings containing the aforesaid bulkhead/shell plate monocoque structure.

8 Claims, 13 Drawing Figures

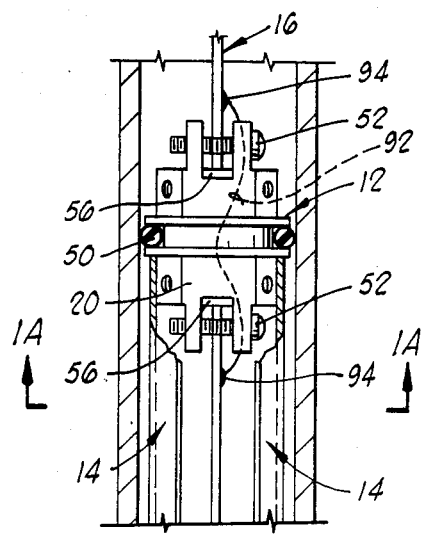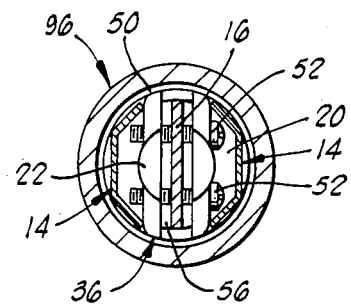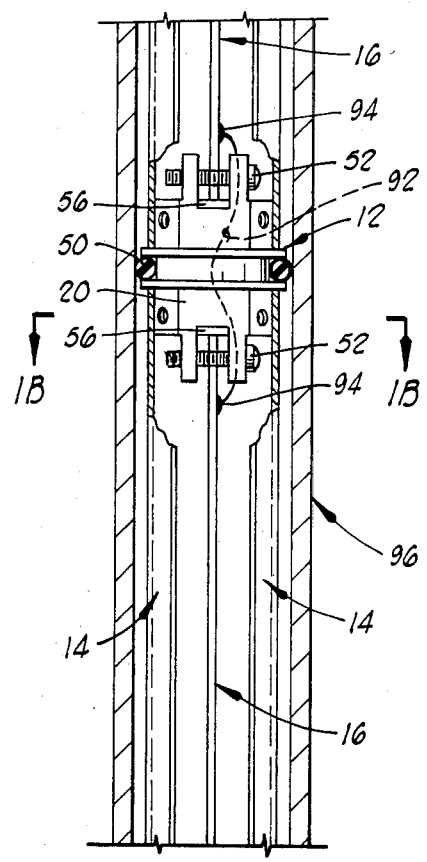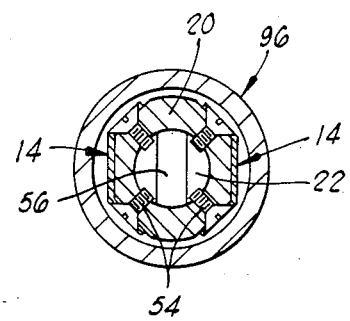
FIG. 1
FIG. 1A
FIG. 1B

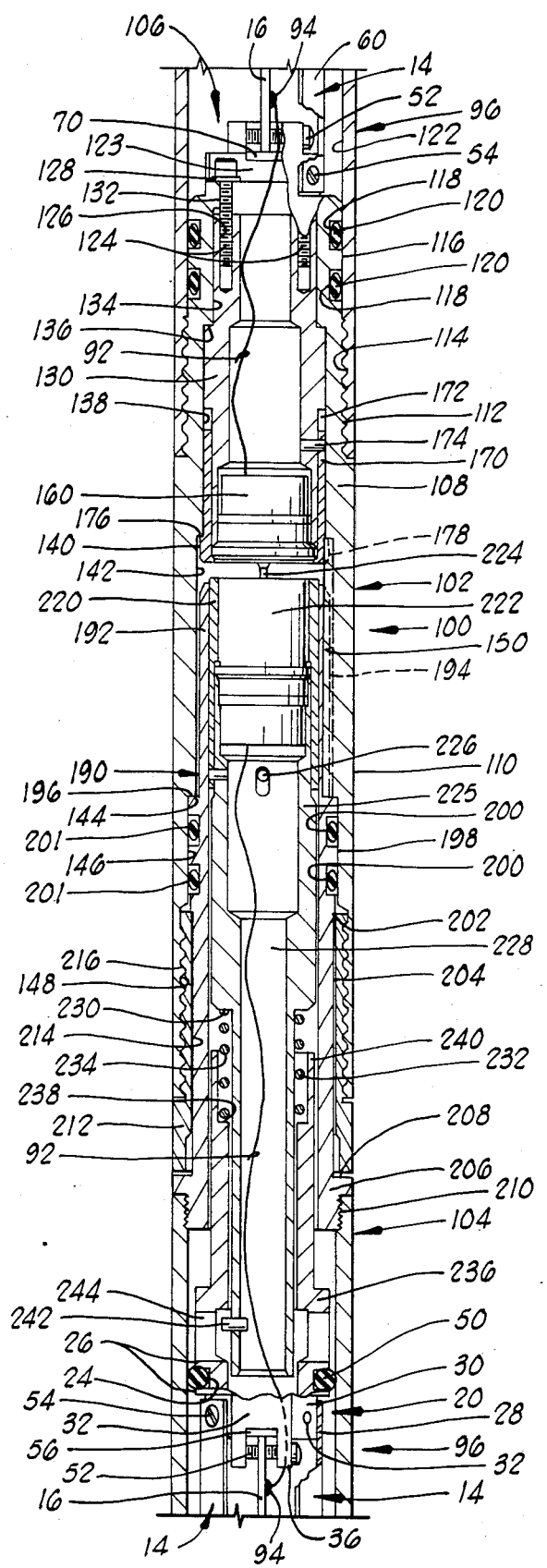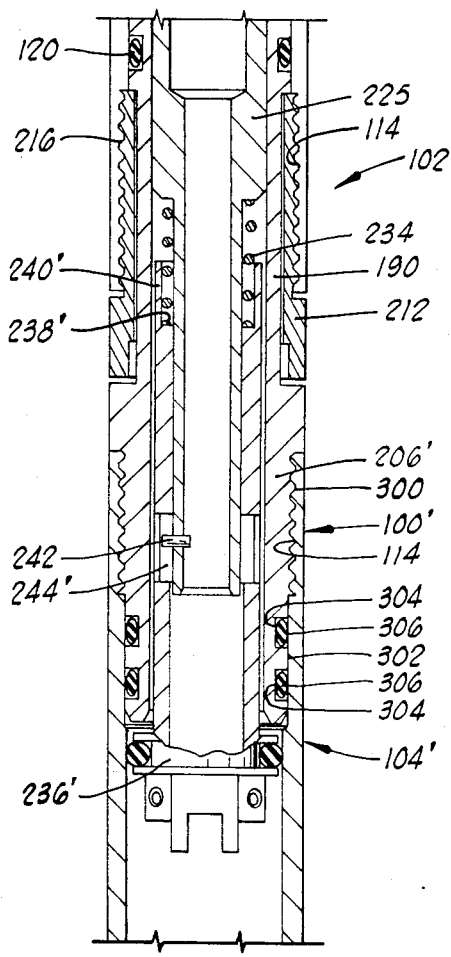
FIG. 2
FIG. 3

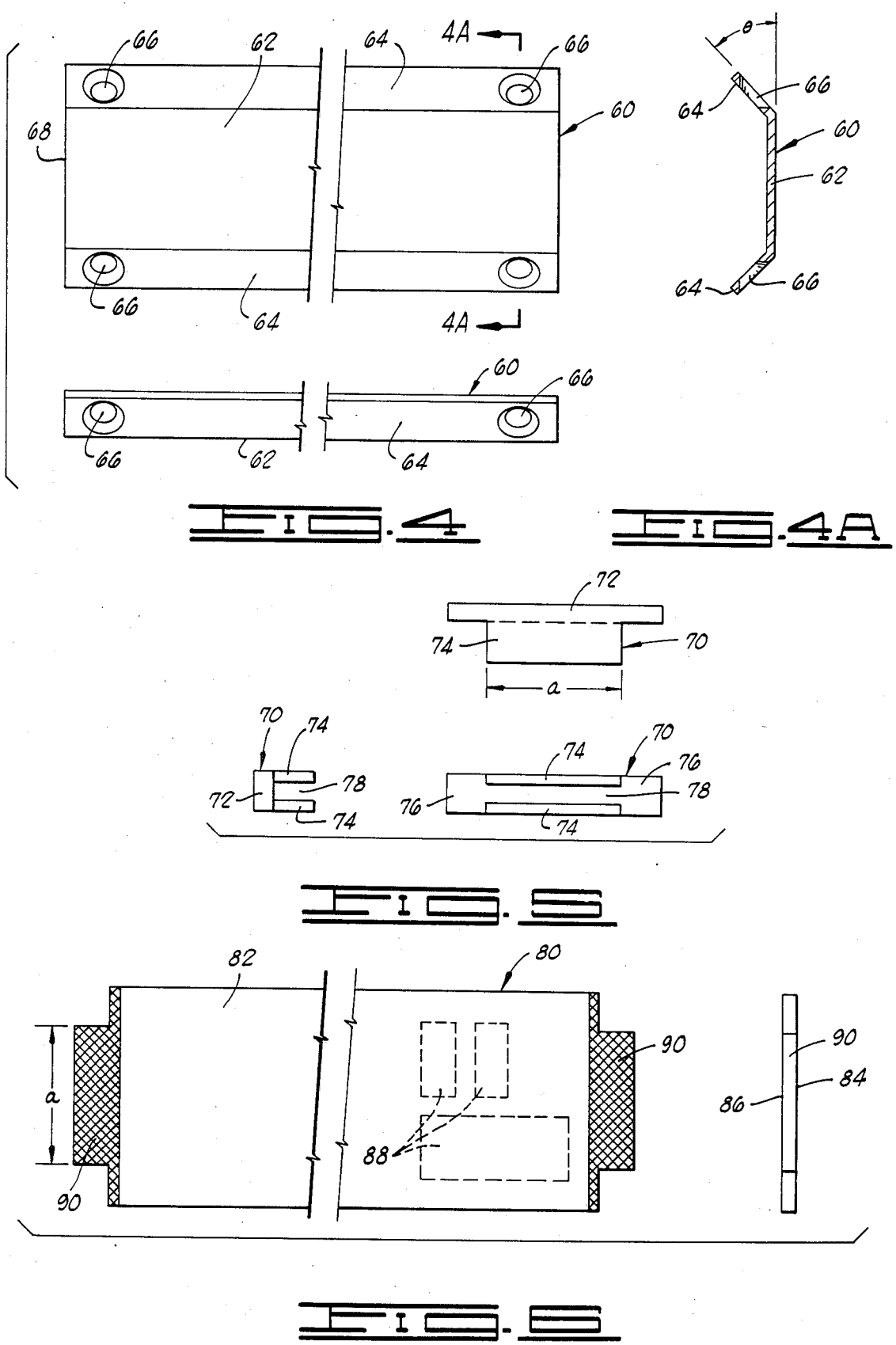

EXOSKELETAL PACKAGING SCHEME FOR CIRCUIT BOARDS

BACKGROUND OF THE INVENTION

The present invention relates to the deployment of electronic circuitry and components in hostile environments, most particularly in the bores of oil and gas wells. While electronic circuitry and components which can survive the temperature extremes encountered in well bores and which have a sufficiently low power draw to permit the use of battery power are known in the art, a recurring problem encountered by designers of downhole tools including instruments incorporating such circuits and components is the isolation of same from the shock and vibration encountered as a matter of course during the trips into and out of well bores, as well as that generated by streams of flowing gas and oil, and the deployment and operation of other tools, such as perforating guns, in the well bore. While attempts have been made to solve such problems, there is a present lack of a packaging arrangement for downhole instruments which will provide substantial shock and vibration isolation as well as protection from damage resulting from normal handling during testing, maintenance and repair of the instruments, while affording easy access to the circuitry and components and rapid, reliable electrical connection and disconnection between a series of instrument-containing tools in the same string.

SUMMARY OF THE PRESENT INVENTION

The present invention comprises an exoskeletal packaging arrangement for downhole tool electronic circuitry and components which provides isolation from shock and vibration when the tool is deployed in a well bore and protection of the circuitry and components from damage during normal handling for testing, maintenance and repair of the instruments, while providing ready access for such testing, repair, maintenance, etc. The invention includes at least two bulkheads having means thereon to secure printed circuit boards or other electronic related structures therebetween in substantial isolation from shock and vibration, with shell plates extending between adjacent bulkheads and interlocked therewith about the boards or other structures. The resulting monocoque structure is self-supporting and self-protecting, and may be easily handled and disposed inside the tubular instrument housings normally employed in such downhole tools. A rapid connect/disconnect coupling for use with the monocoque structure of the present invention is also part of the present invention, such coupling providing positive alignment of electrical connector components, a spring-biased electrical connection and isolation of the electrical connection from the hostile environment outside of the tool.

BRIEF DESCRIPTION OF THE DRAWINGS

The present invention will be more readily understood by a review of the following detailed description of the preferred embodiments thereof, taken in conjunction with the accompanying drawings, wherein:

FIG. 1 is a horizontal sectional elevation of a preferred embodiment of the monocoque structure of the present invention illustrating the manner in which a circuit board is supported by the monocoque structure in an instrument housing.

FIGS. 1A–1B are sections taken across lines A—A and B—B, respectively, of FIG. 1.

FIG. 2 is a horizontal sectional elevation of a first preferred embodiment of a coupling employed in the present invention.

FIG. 3 is a horizontal sectional elevation of a second preferred embodiment of a coupling employed in the present invention.

FIG. 4 is a side and top elevation of a shell plate employed in the monocoque structure of the present invention.

FIG. 4A is a section across the top elevation of the shell plate illustrated in FIG. 4.

FIG. 5 includes front, top and side views of an edge cushion employed to support a printed circuit board at a bulkhead in the monocoque structure of the present invention.

FIG. 6 is a top and side elevation of a printed circuit board blank such as may be employed to hold circuits and components in the monocoque structure of the present invention.

DETAILED DESCRIPTION AND OPERATION OF THE PREFERRED EMBODIMENT

Figure 7:
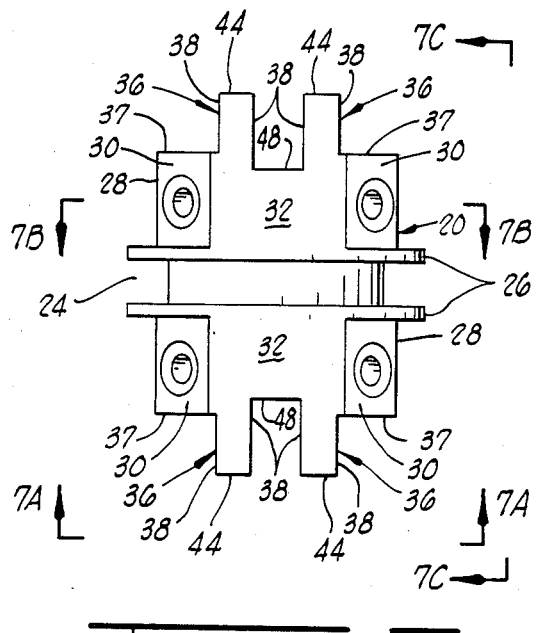
FIG. 7 is a side elevation of the bulkhead employed in the monocoque structure of the present invention.

Referring to FIGS. 1 and 4–7 of the drawings, the exoskeletal or monocoque packaging structure 10 of the present invention comprises several discrete elements which, when combined, provide a rigid, shock-isolating construction. These elements, in the preferred embodiment of the invention, include bulkhead means 12, shell plate means 14, and a circuit and/or component mounting board means 16.

Figure 7C:
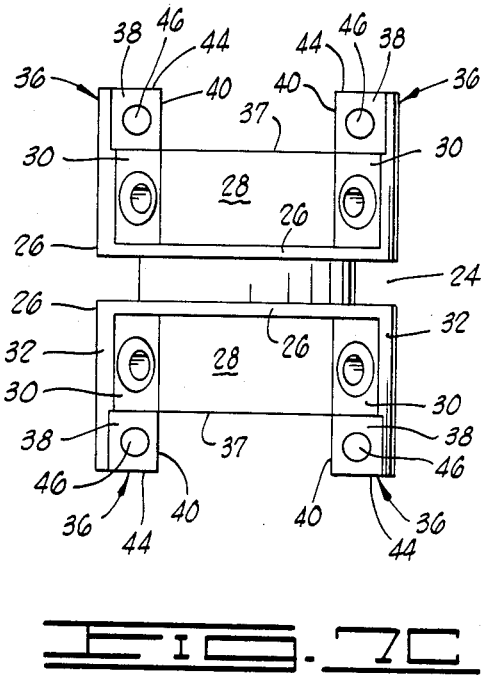
FIGS. 7A–7C are sections taken across lines A—A, B—B and C—C, respectively, of FIG. 7.
Figure 7A:
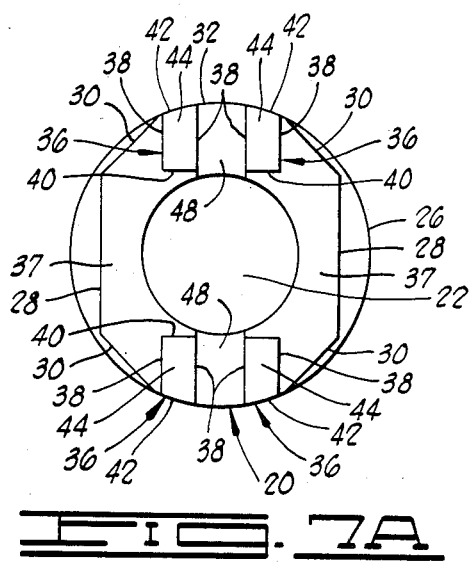
Figure 7B:
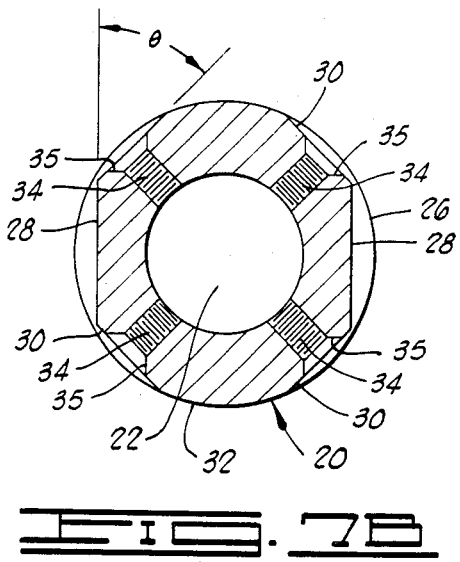

Referring to FIGS. 7 and 7A–7C of the drawings, bulkhead means 12 includes body 20 having axial bore 22 running therethrough. At the exterior midsection of body 20, circumferential groove 24 is bounded by annular shoulder 26. Adjacent both of these shoulders, the top and bottom exterior of body 20 comprises horizontally flat (with reference to FIG. 7) diametrically opposed surfaces 28 terminating laterally at oblique side surfaces 30 which in turn run into arcuate sides 32 of substantially the same radius of curvature as shoulders 26. Each oblique side surface is tapped with a threaded aperture 34, having counter-sunk entrance 35, at right angles thereto. Vertically flat body ends 37 drop inwardly from surfaces 28 and 30. Paired mounting struts 36 extend longitudinally from each end of body 20, struts 36 including horizontally flat upper and lower surfaces 38, vertically flat inner surfaces 40, arcuate outer surfaces 42 of substantially the same radius of curvature as body sides 32, and vertically flat end surfaces 44. A vertically oriented threaded aperture 46 is tapped through the top strut of each pair of vertically aligned struts 36. Vertically flat cushion insert recess 48 extends from side to side of body 20 between upper and lower struts 36 at each end thereof, cutting across body end surfaces 37 and bore 22.

Bulkhead means further includes elastomeric shock rings 50 contained in annular groove 24 by shoulders 26, set screws 52 which are threaded into apertures 46 in struts 36, cushion inserts 56 (see FIG. 5) and flathead screws 54 which are threaded into apertures 34 in oblique side surfaces 30 of body 20 to secure shell plate means 14 thereto (see FIG. 1).

Referring to FIGS. 4 and 4A, shell plate means 14 comprises a rigid shell plate 60 having a major longitudinal portion 62 laterally bounded by oblique edge portions 64 disposed at an angle $\phi$ to major portion 62, angle $\phi$ being substantially the same as the angle $\phi$ at which oblique side surfaces 30 are disposed to surfaces 28 on body 20. Countersunk aperture 66 having frustoconical side walls are disposed at the longitudinal extents of edge portions 64 of shell plate 60 and are adapted to receive the heads of flathead screws 54 which secure shell plate means 14 to body 20, thereby providing a flush exterior surface. The ends 68 of shell plate 60 are at right angles to the longitudinal axis thereof.

Referring to FIG. 5 of the drawings, elastomeric cushion inserts 70 include vertically oriented end face 72 having upper and lower lips 74 protruding from one side thereof. Wings 76 extend end face 72 laterally beyond lips 74. End face 72 is sized so as to fit cushion insert recess 48 between struts 36 on body 20. Lips 74 and end face 72 define a cavity 78 adapted to receive an end tab 90 of circuit board 80 (see FIG. 5).

Mounting board means 16 (see FIG. 6) comprises circuit board 80 including a major longitudinally extending circuit and component mounting card 82 having upper and lower surfaces 84 and 86, respectively. Circuits (not shown) may be printed or otherwise placed on either or both of surfaces 84 and 86 of card 82, and components 88, shown in broken lines, may likewise be affixed to either or both of said surfaces. As used herein, the general terms "circuits" and "components" are generally inclusive so as to encompass diodes, transistors, micro processors, transducers, batteries, solid state or magnetic memory, amplifiers and other such items as are known in the art. At either end of board 80, end tabs 90 extend longitudinally therefrom. End tabs 90 are of a lateral extent "a" which is substantially the same as that of the length "a" of lips 74 on cushion 70, and which will permit the insertion of end tabs 90 into recesses 78 when the former are disposed adjacent cushion insert surface 48 on a body 20, end tabs 90 passing between set screws 52 in struts 36. The crosshatched portion shown on board 80 in FIG. 6 defines the area where circuits and/or components are not to be located, due to the overlap of cushion lips 74 and struts 36 over end tabs 90 and surfaces 84 and 86.

Referring again to FIG. 1 and to FIGS 1A and 1B, it will be readily apparent how the monocoque packaging structure 10 of the present invention provides a rigid structure, via bulkhead means 12 and shell plate means 14, for insertion within a tool instrument housing 96. Board means 16 is contained within this rigid structure and is protected by shell plate means 14 from damage during insertion and removal from housing 96, and other handling. The oblique edge portions 64 of shell plate means 14 interact with cooperating side surfaces 30 on body 20 of the bulkhead means 10 to prevent flaking of the structure. Cushion inserts 56 provide shock absorption for board means 16, as do shock rings 50. Conductor wires 92 provide electrical communication between adjacent board means 16 through bores 22 of bodies 20 of bulkhead means 12.

It should be noted that electrical connections between board means 16 adjacent to the same bulkhead means 12 via conductor wires 92 may be by brazing, soldering or otherwise to each board means at points 94.

In connecting components and circuitry disposed in one instrument housing 96 to other components and circuits, batteries, sensors, etc., in another adjacent housing 96 in the tool string, use of permanently conductor wires is obviously unsuitable. The present invention, however, also contemplates and includes a coupling which may be employed at one or both ends of a tool instrument housing 96 to mechanically and electrically connect adjacent housings 96 in a reliable manner, while also providing for rapid disconnection when the need arises.

DETAILED DESCRIPTION OF THE PREFERRED EMBODIMENTS OF THE COUPLING OF THE PRESENT INVENTION

Referring to FIG. 2, a first preferred embodiment of a coupling 100 is shown connecting board means in adjacent housings 96. Coupling 100 includes a first portion 102 and a mating second portion 104.

First portion 102 of coupling 100 includes a case to coupling anchor 106, which includes a tubular body 108 having a cylindrical exterior leading edge 110, above which exterior threads 112 engage internal threads 114 on tubular instrument case or housing 96. Above threads 112 is seal surface ring 116, having two annular grooves 118 therein holding elastomeric O-rings 120, which provide a seal against the inner wall 122 of housing 96. Above seal surface 116, the exterior of anchor 106 is substantially the same as that of a bulkhead means body 20, having surfaces 28 and 30 thereon, the surface 30 having threaded apertures 34 tapped thereinto at right angles thereto. Struts 36 protrude from the board means end of anchor 106, and set screws 52 are secured in struts 36. A board means 16 is disposed in a cushion insert 70, and a conductor wire 92 is connected to board means 16 at 94, extending therebelow. Shell plate means 14 comprising rigid shell plate 60 is secured to anchor 106 by flat head screws 54 in the same manner shown in FIG. 1. The other end (not shown) of shell plate means is secured to a bulkhead means 12 disposed further inside housing 96.

On the upper end of the interior of anchor 106, a vertical slot 123 extends between the struts 36 on the centerline of anchor 106. Slot 123 provides access for two longitudinally extending bolts 124 which are threaded into apertures 126 in pin holder base 130, flanges 128 on the heads of bolts 124 acting upon shoulders 132 on the interior of anchor 106 to secure pin holder base 130 therewithin. Below shoulder 132 is cylindrical base bore wall 134, which terminates in radially flat annular wall 136 leading to larger pin connector bore wall 138 in turn terminating at shallow annular rim 140. Below rim 140, receptacle bore wall 142 extends to outwardly radially extending shoulder 144, followed by cylindrical polished seal surface 146 and internal threads 148. Alignment key 150 extends inwardly from receptacle bore wall 142.

Pin connector body 160, which may be a male insert for a MIL-C-38999 series III connector, is disposed inside tubular pin cap key 170, which extends over the leading outer surface 172 of pin holder base 130, and is maintained thereon by one or more roll pins 174, which extend through aligned apertures (unnumbered) in both components. Annular shoulder 176 on pin cap key 170 abuts rim 140 on the interior of anchor 106. At the top of pin cap key 170 is slot 178, which accommodates alignment key 150, maintaining pin holder base 130, pin connector body 160 and pin cap key 170 in rotational alignment with anchor 106.

Second portion 104 of coupling 100 includes keyway nose 190, which extends into first portion 102 of coupling 100. Keyway nose 190 includes a leading thin-walled tubular portion 192 having a slot or keyway 194 therein of a size to accommodate alignment key 150 on the interior of first portion 102 (anchor 106). Trailing tubular portion 192 and therebelow in FIG. 2 is annular shoulder 196, which extends radially outward to cylindrical seal ring surface 198 having annular grooves 200 therein, which contain O-rings 201. O-rings 201 effect a pressure seal against polished seal surface 146. Below seal ring surface 198, shallow annular shoulder 202 extends slightly inwardly to cylindrical coupling bolt saddle 204, which extends to transition sub 206 having outwardly radially extending shoulder 208, transition sub 206 being welded at 210 to housing 96.

Tubular coupling bolt 212 surrounds keyway nose 190 in free rotational relationship thereto on saddle 204, between shoulders 202 and 208. Bolt 212 has a cylindrical bore 214 and a threaded exterior 216, which engages internal threads 148 on first portion 102, thereby mating up first and second portions 102 and 104 of coupling 100.

Inside nose 190 tubular locking socket sleeve 220 accommodates socket connector body 222, one or more pins 124 from pin connector body 160 extending thereinto. Socket connector body 222 may be a female insert for a MIL-C-38999 series III connector. The trailing (lower) portion of sleeve 220 is secured to socket base 225 via a plurality of roll pins 226, extending through mutually aligned apertures (unnumbered) in the walls of sleeve 220 and base 224. Bore 228 of socket base 224 provides a passageway for conductor wires 92 (one shown) to a board 16. The exterior of socket base 224 necks down via shoulder 230 to cylindrical spring saddle 232, about which coil spring 234 is disposed. Socket to backbone link 236 extends telescopingly about spring saddle 232, and spring 234 bears against shoulder 230 on socket base 224 and shoulder 238 inside overshot 240 on link 236. One or more roll pins 242 protrudes from spring saddle 232 into wells 244 in link 236, preventing the spring bias of spring 234 from separating base 224 and link 236. The lower portion of link 236 includes one-half of a bulkhead body 20 having horizontally flat surface 28, oblique side surfaces 30, arcuate sides 32 and threaded apertures 34 in side surfaces 30. An elastomeric shock ring 50 is contained in annular groove 24 by shoulders 26. Set screws 52 in struts 36 and a cushion insert 56 maintains board 16 in place, to which conductor wire 92 is secured at 94. Shell plate means 14 are secured to link 236 via flathead screws 54.

An alternative embodiment 100' of coupling 100 is depicted in FIG. 3 and generally described hereafter. First portion 102 of coupling 100' is identical to that of coupling 100, and so will not be further discussed. Second portion 104' employs the same keyway nose 120, except that transition sub 206' is tubular and possesses external threads 300 thereon, below which seal ring surface 302 having grooves 304 therein carries seal rings 306. Housing 96 in this embodiment is threaded as in the upper portion of FIG. 2, threads 114 on housing 96 mating with threads 300, and seal rings 306 effecting a pressure-tight seal between nose 190 and housing 96. Socket nose 225 is the same as that of FIG. 2, as is spring 234. However, socket to backbone link 236', while substantially the same as link 236 where it encompasses socket base 224, is longitudinally extended to accommodate the greater length of transition sub 206'. The lower portion of link 236' is substantially identical to that of link 236. As with link 236, one or more roll pins 242 extend into (shallow) wells 244' to prevent separation of socket nose 225' and link 236'.

In operation, both couplings 100 and 100' join in similar fashion, e.g., via threaded connections. The use of free-rotating coupling bolts 212 prevents rotation of the adjacent housings 96 with respect to each other, and the use of keys 150 and accommodating slots in both halves of the couplings assures alignment of the pins of pin connector body 160 with the sockets of socket connector body 222. Spring 234 assures proper loading of the pin/socket connection, while O-rings 200 provide a pressure-tight environmental seal between the two portions of coupling 100. The use of a coupling incorporating the monocoque packaging structure of the present invention assures structural integrity of the entire coupling/board assembly outside of the tool housing while providing shock isolation for the electrical components and circuitry.

Thus it is apparent that a novel and unobvious electronics packaging arrangement including a coupling configuration has been invented. While the present invention has been disclosed in terms of preferred embodiments, it is evident that many additions, deletions and modifications may be made thereto without departing from the spirit and scope of the claimed invention. For example, multiple circuit boards in a horizontally or vertically stacked configuration might be employed; shell plates running along the sides of a circuit board between the bulkheads may be used; components may be mounted on a flexible, rolled board which is mounted between bulkheads; heat-conductive cushions and shock rings may be employed to facilitate heat transfer from the electrical components to the exterior of the tool housing; fastening means other than screws may be employed to secure the shell plates to the bulkheads; and others.

I claim:

1. An exoskeletal packaging arrangement for the disposition of instrument components in a tubular housing for deployment in a well bore, comprising:
   two bulkhead means each including a truncated cylindrical body having a longitudinal bore therethrough and having on at least one end thereof a plurality of diametrically opposed flat surfaces laterally bounded by angularly disposed side surfaces having apertures therein;
   at least two shell plates extending between said bulkhead means, said shell plates each comprising longitudinally extending major portions laterally bounded by substantially co-extensive edge portions angularly disposed thereto at substantially the same angles as said side surfaces are disposed with respect to said flat surfaces, said shell plates having apertures therethrough at each end thereof aligned with said side surface apertures, said bulkhead means further including fasteners extending through said shell plate apertures and into said side surface apertures; and
   longitudinally extending board means having tab means at each end thereof supported by said bulkhead means.

2. The arrangement of claim 1, wherein said body further includes longitudinally extending struts paired on each side of said longitudinal bores, a cushion insert recess extending across the face of said body between each strut of said pair of struts and across said longitudinal bore, and a cushion insert disposed in said recess.

3. The arrangement of claim 2, wherein each strut of a strut pair includes an aperture therethrough aligned with that of the other strut of the pair, said cushion insert includes an end face having upper and lower lips protruding from one side thereof and laterally extending wings extending beyond said lips, said cushion insert is disposed in said recess with said end face in contact therewith and said wings extending between said struts, a tab means of said board means is disposed between said lips, and set screws are disposed through said aligned apertures in said struts.

4. The arrangement of claim 1 or 2, further including a circumferential annular groove about said body, and a shock ring disposed in said groove.

5. The arrangement of claim 4, wherein said body is symmetrical on both sides of said annular groove.

6. The arrangement of claim 3, wherein one side of at least one of said bulkhead means includes coupling means extending therefrom, and said board means is electrically connected to said coupling means through said longitudinal body bore.

7. The arrangement of claim 6, wherein said coupling means includes a connector body, rotational alignment means and means to secure said coupling means to a mating coupling means in sealing relationship thereto.

8. The arrangement of claim 6, wherein said coupling means includes a connector body, rotational alignment means, longitudinal spring biasing means, and means to secure said coupling means to a mating coupling means in sealing relationship thereto.

* * * * *